(12) United States Patent
Abdullah et al.

(10) Patent No.: US 10,049,935 B2
(45) Date of Patent: Aug. 14, 2018

(54) INTEGRATED CIRCUIT PACKAGE HAVING PIN UP INTERCONNECT

(71) Applicant: QDOS Flexcircuits Sdn Bhd, Bayan Lepas (MY)

(72) Inventors: Zalina Binti Abdullah, Bayan Lepas (MY); Roslan Bin Ahmad, Bayan Lepas (MY); Poh Cheng Ang, Bayan Lepas (MY); Poh Choon Whong, Bayan Lepas (MY); Hai San Tew, Bayan Lepas (MY); Shin Hung Hwang, Bayan Lepas (MY); Chee Can Lee, Bayan Lepas (MY); Tiyagarajan S/O Arumugham, Bayan Lepas (MY)

(73) Assignee: QDOS FLEXCIRCUITS SDN BHD, Bayan Lepas (MY)

( * ) Notice: Subject to any disclaimer, the term of this patent is extended or adjusted under 35 U.S.C. 154(b) by 0 days.

(21) Appl. No.: 15/476,423

(22) Filed: Mar. 31, 2017

(65) Prior Publication Data
US 2017/0323830 A1    Nov. 9, 2017

(30) Foreign Application Priority Data

Mar. 31, 2016  (MY) .......................... PI 2016701182

(51) Int. Cl.
*H01L 23/498* (2006.01)
*H05K 3/46* (2006.01)
(Continued)

(52) U.S. Cl.
CPC ............ *H01L 21/82* (2013.01); *H01L 21/311* (2013.01); *H01L 21/762* (2013.01); *H01L 23/4924* (2013.01); *H01L 23/49811* (2013.01); *H01L 23/49827* (2013.01); *H01L 23/522* (2013.01); *H01L 23/5226* (2013.01); *H01L 23/538* (2013.01); *H05K 1/113* (2013.01); *H05K 3/184* (2013.01); *H05K 3/4007* (2013.01);
(Continued)

(58) Field of Classification Search
CPC ......... H01L 23/49811; H01L 23/49827; H01L 23/522; H01L 23/5226; H01L 23/538; H01L 23/5383; H01L 21/7684; H05K 3/4647; H05K 3/4661; H05K 3/184; H05K 3/185; H05K 3/4038; H05K 3/403; H05K 3/4007; H05K 1/113
See application file for complete search history.

(56) References Cited

U.S. PATENT DOCUMENTS 9,282,626 B2 *  3/2016  Yoo .......................... H05K 1/02
2009/0175017 A1 *  7/2009  Kita ...................... H01L 21/481
                                                        361/792

(Continued)

*Primary Examiner* — Michael Trinh
(74) *Attorney, Agent, or Firm* — Preston Smirman; Smirman IP Law, PLLC (57) ABSTRACT

An integrated circuit package and manufacturing method thereof are described. The integrated circuit package includes pin up conductive plating to form an interconnect, where an opening on a patterned fifth layer photo-resist material located at bottom portion of a base developed for etching selectively the base to form at least an internal opening and at least a positioning opening, wherein the internal opening corresponds with an inside area of a first patterned conductive layer, and the positioning opening corresponds with an outside area of the first patterned conductive layer.

13 Claims, 4 Drawing Sheets

(51) Int. Cl.
| | |
|---|---|
| *H01L 21/82* | (2006.01) |
| *H01L 21/311* | (2006.01) |
| *H01L 21/762* | (2006.01) |
| *H01L 23/522* | (2006.01) |
| *H01L 23/538* | (2006.01) |
| *H01L 23/492* | (2006.01) |
| *H05K 1/11* | (2006.01) |
| *H05K 3/40* | (2006.01) |
| *H05K 3/18* | (2006.01) |

(52) U.S. Cl.
CPC ......... *H05K 3/4038* (2013.01); *H05K 3/4647* (2013.01); *H05K 3/4661* (2013.01)

(56) References Cited

U.S. PATENT DOCUMENTS

| | | | |
|---|---|---|---|
| 2014/0374150 A1* | 12/2014 | Inagaki | H05K 1/113 174/258 |
| 2015/0366062 A1* | 12/2015 | Noda | H01L 23/49822 361/803 |
| 2016/0343645 A1* | 11/2016 | Pan | H01L 23/16 |

\* cited by examiner

INTEGRATED CIRCUIT PACKAGE HAVING PIN UP INTERCONNECT

CROSS-REFERENCE TO RELATED APPLICATION

The instant application claims priority to Malaysia Patent Application Serial No. PI 2016701182 filed Mar. 31, 2016, the entire specification of which is expressly incorporated herein by reference.

FIELD OF THE INVENTION

The invention relates in general to an integrated circuit package and manufacturing method thereof, and more particularly to an integrated circuit package having pin up conductive plating to form an interconnect.

BACKGROUND OF THE INVENTION

Recently, there was an increase in the number of terminals and the narrowing of their pitches in the semiconductor or integrated circuit device which result from advancements in the performance of operations, the capability of performing multi tasks and the integration thereof, which results in the growing demands of the interconnecting substrate for packaging which carries the semiconductor device also attains a higher density in arrangement and interconnections.

The current interconnecting substrate for packaging in-use, which are made of build-up multi-layered substrate, a sort of multi-layered interconnecting substrate.

Glass epoxy print substrates which are used as the base core substrate, which build-up multi-layered substrate is fabricated by forming an epoxy resin layer on both surfaces of this glass epoxy print substrate. Then, forming via holes in these epoxy resin layers by means of photolithography or laser. After that, plating method and the photolithography with a combination of the electroless or electrolytic Cu, in which an interconnection layer and via conductors are formed such that the formation of build-up layered structure is archived.

However, the glass epoxy print substrate may cause a problem that the heat treatments performed in fabrication of the build-up multi-layered substrate may bring the glass epoxy print substrate to a poor condition and creating defects. Furthermore, the heat treatments carried out at the time of chip loading and solder reflow may cause the faulty connection and the distortion which affects the long-term reliability for the connection.

Moreover, the interconnecting substrate for packaging is mounted on an external board or apparatus, the stress is structurally centered on the interface between the external electrode terminal and the insulating layer, which tends to give rise to opening defects so that the satisfactory mounting reliability cannot be obtained.

SUMMARY OF THE INVENTION

Therefore the purpose of overcoming the above problems, there have been proposed an integrated circuit package and manufacturing method thereof, and more particularly to an integrated circuit package having pin up conductive plating to form an interconnect.

One aspect of the present invention provides a method of fabricating an integrated circuit packaging, comprising the steps of:

establishing a base;

developing a plurality of electrical circuits using a first patterned conductive layer on the base, wherein an electrical circuit are formed by using a masking material;

developing a stud conductive plating, where the stud conductive plating is disposed on at least one side of the first patterned conductive layer by developing a second layer photo-resist material on the masking material;

removing the masking material and second layer photo-resist material;

developing an epoxy or polymide compound on the base and exposed area of the stud conductive plating grinding the surface area of the epoxy or polymide compound to level the surface of the stud conductive plating and the disposed epoxy or polymide compound to form a flattened surface area;

developing third a photo-resist layer of materials on the flat surface area of the surface of the stud conductive plating and the epoxy or polymide compound;

developing a second electrically conductive layer on the leveled stud conductive plating by removing at least one part of the layers of third photo-resist materials;

developing an isolation layer on the flat surface area of the surface of the stud conductive plating and the epoxy or polymide compound;

grinding the surface area of the isolation layer to level the isolation layer surface and the second electrically conductive layer;

developing an conductive plating layer on grinded surface of the primer ink layer and the second electrically conductive layer;

developing a fourth photo-resist materials on the electroless conductive seed plating layer developing a third electrically conductive layer by removing at least one part of the layers of fourth photo-resist materials;

removing the remaining third electrically conductive layer;

etching the layer of third electrically conductive layer by using semi-additive processing etching line;

developing a solder masking layer on the third electrically conductive layer disposed on the electroless conductive seed layer plating;

developing a solder mask by removing at least one part of the solder masked surface;

developing a fifth layer photo-resist material disposed on the surface of the solder masked surface and bottom portion of the base; and developing an opening on the patterned fifth layer photo-resist material located at bottom portion of the base for etching selectively the base to form at least an internal opening and at least a positioning opening, wherein the internal opening corresponds with an inside area of the first patterned conductive layer, and the positioning opening corresponds with an outside area of the first patterned conductive layer.

Further, the method of fabricating an integrated circuit packaging comprising the steps of:

developing an interconnect on at least one side of the patterned conductive layer.

Preferably, the first patterned conductive layer and the second patterned conductive layer are disposed within the first patterned conductive layer, in which the other sides of the first patterned conductive layer are located at the same plane with the second side of the second patterned conductive.

Preferably, the thickness of the first patterned conductive layer reduced by trimming at least one surface of the first patterned conductive layer.

Further, the surface of the first patterned conductive layer is trimmed by using chemical process or mechanical grinding process or laser trimming process or plasma treatment or any combination thereof.

Preferably, the masking material is a mask set or photolithography material or masked pattern or any combination thereof.

Further, the base is completely removed.

Preferably, the base is selectively removed to form at least an internal opening and at least a positioning opening of the first patterned conductive layer area, wherein the internal opening corresponds with an inside area of the first patterned conductive layer, and the positioning opening corresponds with an outside area of the first patterned conductive layer.

Preferably, the positioning opening is formed using a positioning mark or half-etched indentation or patterns on the base.

Preferably, the base is a charge carrier.

Further, the step of removing the base comprising the steps of: etching the base by using the fifth layer photo-resist material; and removing the fifth layer photo-resist material.

Further, the step of etching the base further comprising the steps of: etching part of the first patterned conductive layer so that the surface of the etched first patterned conductive layer and the surface of the etched first patterned conductive layer are not located at the same plane.

Preferably, the masking material has at least a first opening and at least a second opening, the first opening is corresponding with the inside area of the first patterned conductive layer, and the second opening is corresponding with the outside area of the first patterned conductive layer.

Another aspect of the present invention provides an integrated circuit packaging, comprising:

a plurality of electrical circuits developed using a first patterned conductive layer on a base, wherein the electrical circuit formed by using a masking material;

a stud conductive layer plating disposed on at least one side of the first patterned conductive layer developed by a second layer photo-resist material on the masking material;

an epoxy or polymide compound developed on the base and exposed area of the stud conductive plating a third photo-resist materials developed on the surface area of the surface of the stud plating conductive layer and the epoxy or polymide compound;

a second electrically conductive layer developed on the stud plating conductive layer by removing at least one part of the layers of third photo-resist materials;

an isolation layer developed on the flat surface area of the surface of the stud conductive layer plating and the epoxy or polymide compound;

an electroless conductive seed layer plating developed on grinded surface of the isolation layer and the second electrically conductive layer;

a fourth photo-resist materials developed on the electroless conductive seed layer plating;

a third electrically conductive layer developed by removing at least one part of the layers of fourth photo-resist materials;

a solder masking layer developed on the third electrically conductive layer disposed on the electroless conductive seed layer plating;

a solder mask developed by removing at least one part of the solder masked surface;

a fifth layer photo-resist material developed on the surface of the solder masked surface and bottom portion of the base; and an opening on the patterned fifth layer photo-resist material located at bottom portion of the base developed for etching selectively the base to form at least an internal opening and at least a positioning opening, wherein the internal opening corresponds with an inside area of the first patterned conductive layer, and the positioning opening corresponds with an outside area of the first patterned conductive layer.

Preferably, the third electrically conductive layer is an etched layer of third electrically conductive layer by using semi-additive processing etching line.

Further, the integrated circuit packaging includes an interconnect on at least one side of the patterned conductive layer.

Preferably, the first patterned conductive layer has at least one trimmed surface.

Preferably, the trimmed surface of the first patterned conductive layer is trimmed by using chemical process or mechanical grinding process or laser trimming process or any combination thereof.

Preferably, the masking material is a mask set or photolithography material or masked pattern or any combination thereof.

Further, the base is selectively removed, to form at least an internal opening and at least a positioning opening of the first patterned conductive layer exposed area.

Preferably, the base is selectively removed, to form at least an internal opening and at least a positioning opening of the first patterned conductive layer exposed area, wherein the internal opening corresponds with an inside area of the first patterned conductive layer, and the positioning opening corresponds with an outside area of the first patterned conductive layer.

Preferably, the first patterned conductive layer and the second patterned conductive layer are disposed within the first patterned conductive layer, in which the other sides of the first patterned conductive layer are located at the same plane with the second side of the second patterned conductive.

Preferably, the first patterned conductive layer is exposed to form at least an internal opening and at least a positioning opening by a selectively removing the base.

Preferably, the base is a selectively removed forming at least an internal opening and at least a positioning opening, wherein the internal opening corresponds with an inside area of the first patterned conductive layer, and the positioning opening corresponds with an outside area of the first patterned conductive layer.

Preferably, the positioning opening has a positioning mark, half-etched indentation, full-etched indentation patterns or any combination thereof on any one of the dielectric layer.

Preferably, the base is a charge carrier.

Further, the base etched using the masking material as a mask.

Preferably, the dielectric layer is a thin-film encapsulation or otherwise encapsulated.

Preferably, the interconnect is a metal finishing or organic finishing or any combination thereof.

The present invention consists of features and a combination of parts hereinafter fully described and illustrated in the accompanying drawings, it being understood that various changes in the details may be made without departing from the scope of the invention or sacrificing any of the advantages of the present invention.

DETAILED DESCRIPTION OF THE INVENTION

To further clarify various aspects of some embodiments of the present invention, a more particular description of the invention will be rendered by references to specific embodiments thereof, which are illustrated in the appended drawings. It is appreciated that these drawings depict only typical embodiments of the invention and are therefore not to be considered limiting of its scope. The invention will be described and explained with additional specificity and detail through the accompanying drawings in which:

FIGS. 1-25 are detailed process flowcharts of manufacturing and connecting for an integrated circuit package according to a first embodiment of the invention.

Figure 1:
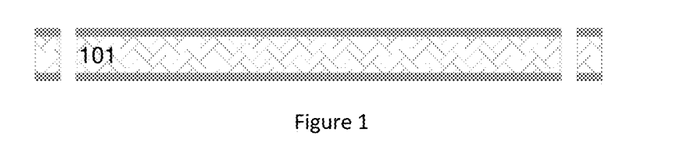
FIG. 1 illustrates an integrated circuit package according to at least one embodiment of the invention.

FIG. 1 illustrates an integrated circuit package according to at least one embodiment of the invention. Firstly, a carrier or base (101) is established or developed, wherein the base (101) is a steel material or copper or conductive material such as charge carrier. Preferably, the carbon steel or steel having thickness in the range of 0.005-0.500 mm, wherein the plated conductive layer having thickness in the range of 3-120 µm.

Figure 2:
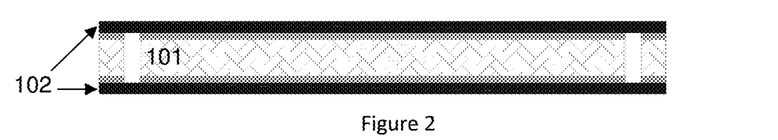
FIG. 2 illustrates layers of photo-resist materials are developed on a base, in which the layers are then developed or formed as patterned layers of photo-resist materials.

FIG. 2 illustrates layers of photo-resist materials (102) are developed on the base (101), in which the layers are then developed or formed as patterned layers of photo-resist materials (102). Alternatively, the layers of photo-resist materials (102) are also formed on both surfaces of the carrier or base (101), bottom part and top part. The purpose of photo-resist materials (102) on the top portion is to create a masking for circuit patterning. However, the photo-resist materials (102) on the bottom portion are to avoid unnecessary buildup of plating material to avoid wastage of the plating material. This photo-resist materials (102) has to on the bottom portion of the carrier or base (101) until demasking process. This process is also known as dry film laminating process by using dry film laminator process, in which the dry film preferably has a thickness in the range of 5-100 µm.

Figure 3:
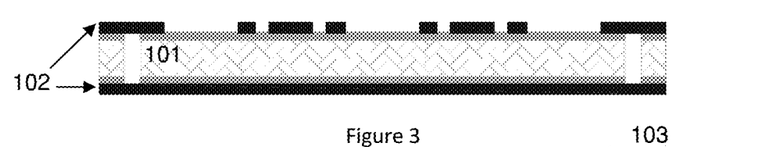
FIG. 3 illustrates development of an electrically conductive layer within the removed or etched part of the layers of photo-resist materials.
Figure 4:
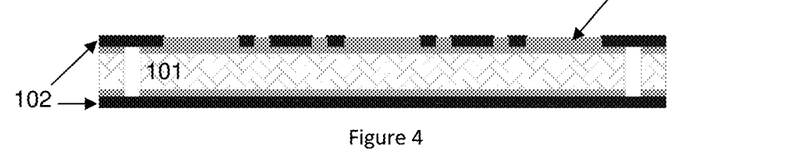
FIG. 4 illustrates the layers of photo-resist materials being removed, leaving the electrically conductive layer, wherein a first conductive layer can be used as electrical circuits or electrical routing.

FIG. 3 illustrates development of an electrically conductive layer (103) within the removed or etched part of the layers of photo-resist materials (102). The electrically conductive layer (103) is developed by using electroplating method. Thereafter, the layers of photo-resist materials (102) will be removed, leaving the electrically conductive layer (103) wherein the first conductive layer can be used as electrical circuits or electrical routing as illustrated in FIG. 4. The layers of photo-resist materials (102) on the bottom part of the carrier or base (101) will still remain. Preferably, the layers of photo-resist materials are removed by Ultra Violet (UV) exposure process, in which the unexposed zone will be removed by developer process. Preferably, the development process of the electrically conductive layer (103) is also known as the process of tracing conductive plating by using copper plating line, in which the conductive trace has a thickness in the range of 5~100 µm.

Then, the electrically conductive layer (103) is developed into a plurality of electrical circuits, which are electrically isolated and used as a package trace layout unit or electrical circuits unit, wherein the electrical circuits unit will be electrically connected to each other. This formation has the same pattern to the integrated circuit that are ready for packaging.

Figure 5:
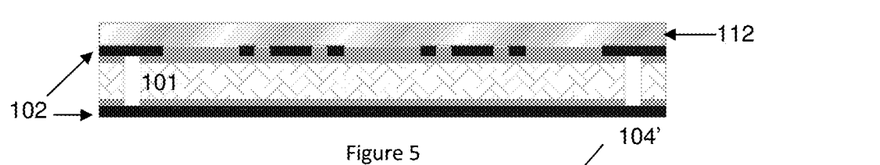
FIG. 5 illustrates a second layer photo-resist material disposed on a surface of a first electrically conductive layer.
Figure 6:
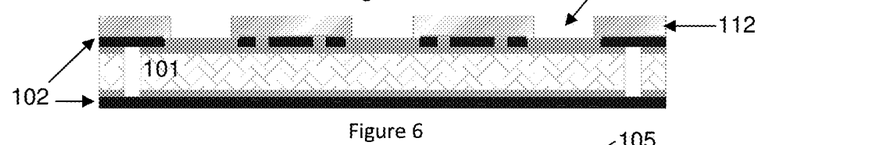
FIG. 6 illustrates a cavity developed on a patterned second layer photo-resist material.

FIG. 5 illustrates a second layer photo-resist material (112) disposed on the surface of the first electrically conductive layer (103'), and a cavity (104') is developed on the patterned second layer photo-resist material (112) as shown in FIG. 6. Preferably, the second layer photo-resist material (112) or second dry film laminate with dry film laminator has a thickness in the range of 5~150 µm.

Figure 7:
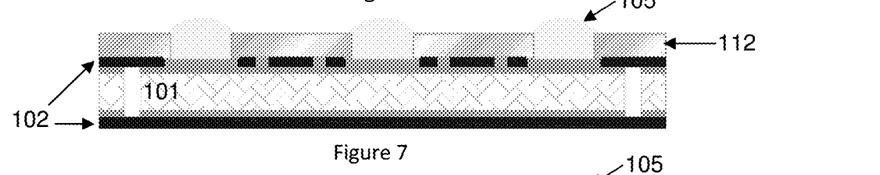
FIG. 7 illustrates a stud conductive layer developed or disposed in the cavity.

Then, stud conductive layer (105) is developed or disposed in the cavity (104') as shown in FIG. 7, wherein the stud conductive layer (105) is developed by way of electroplating. Preferably, the stud conductive layer (105) is an "I" shaped stud conductive layer developed by a plating line.

Figure 8:
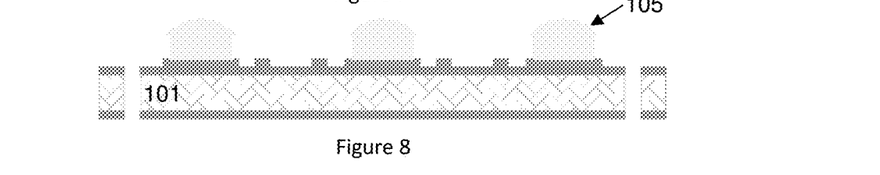
FIG. 8 illustrates remaining first photo-resist materials and second layer photo-resist material being removed or stripped, leaving the stud conductive layer disposed above the electrically conductive layer along the base.

Then, the remaining first photo-resist materials (102) and second layer photo-resist material (112) will be removed or stripped, leaving the stud conductive layer (105) disposed above the electrically conductive layer (103) along the base (101) as illustrated in FIG. 8. Preferably, this process is known as the dry film stripping process.

Figure 9:
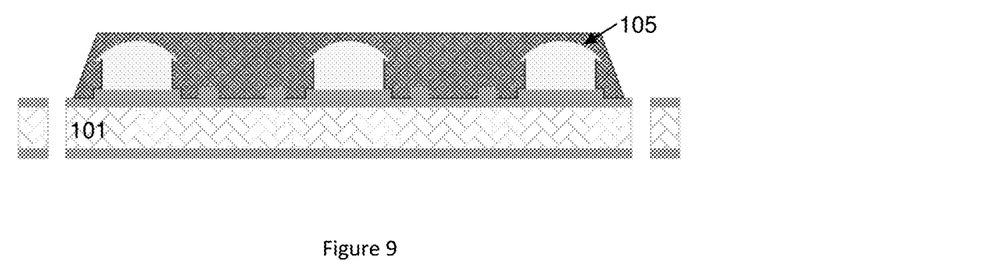
FIG. 9 illustrates an epoxy or polymide process being developed or disposed on the base and exposed area of the stud conductive layer.

Then, an epoxy or polymide process is developed or disposed on the base (101) and exposed area of the stud conductive layer (105) as illustrated in FIG. 9. This process is known as an encap process by using an epoxy molding or polyimide compound.

Figure 10:
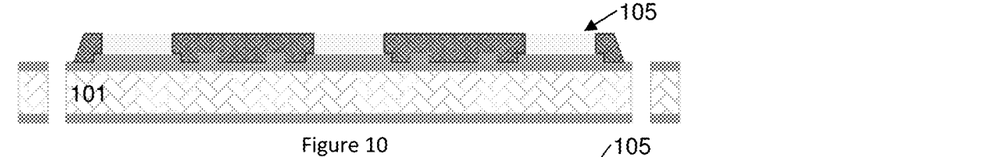
FIG. 10 illustrates, on the surface of the disposed epoxy molding compound, there is performed a grinding or polishing or trimming process known as surface grinding by either mechanical wheel grinding or chemical etching process.

Preferably, by molding or laminate and curing with b-stage adhesive laminate film or laminate and curing with prepreg resin or laminate and curing with resin. Thereafter, on the surface of the disposed epoxy molding compound, there is performed a grinding or polishing or trimming process known as surface grinding by either mechanical wheel grinding or chemical etching process as illustrated in FIG. 10. Preferably, the etching process has a thickness in the control range of 5~200 µm. The surface grinding will flatten the surface of the stud conductive layer (105) and the disposed epoxy molding compound or polyimide laminate to form a flattened surface area, in which the stud conductive layer (105) has a curved angle on the top portion and will be flattened by grinding or polishing the curved angle portion.

Figure 11:
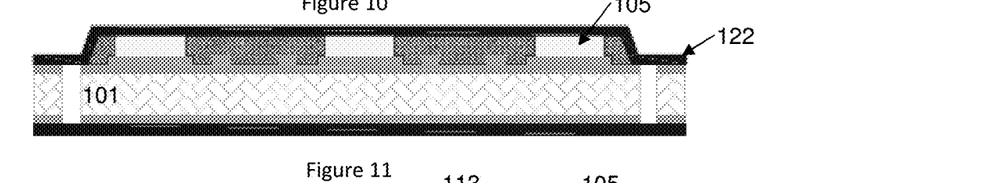
FIG. 11 illustrates layers of third photo-resist materials being developed on the flat surface area of the surface of the stud conductive layer and the epoxy molding compound.

Further, the process includes layers of third photo-resist materials (122) are developed on the flat surface area of the surface of the stud conductive layer (105) and the epoxy molding compound as illustrated in FIG. 11. This process is also known as pin up dry film laminate with a dry film laminator, in which the dry film preferably has a thickness in the range of 5~75 µm.

Figure 12:
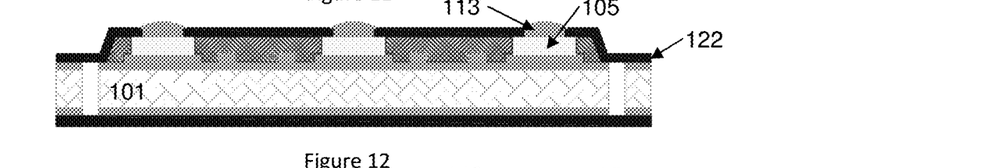
FIG. 12 illustrates development of a second electrically conductive layer within the removed or etched part of the layers of third photo-resist materials.
Figure 13:
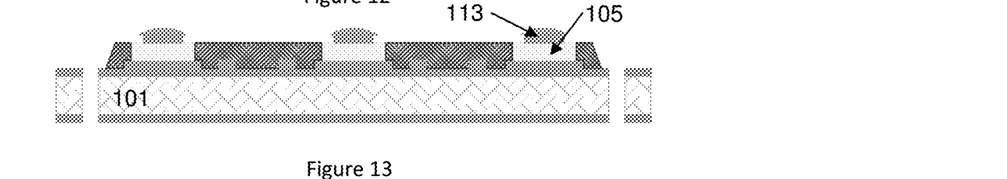
FIG. 13 illustrates the exposed third photo-resist materials being removed, leaving the second electrically conductive layer disposed on the flat surface area of the surface of the stud conductive layer and the encapsulation material being preferably epoxy molding compounds, epoxy laminates or polyimide laminates.

FIG. 12 illustrates development of a second electrically conductive layer (113) within the removed or etched part of the layers of third photo-resist materials (122). Preferably, the third photo-resist materials exposed by Ultra Violet (UV) exposure process, in which the unexposed zone will be removed by using developer process. The second electrically conductive layer (113) developed by using electroless or electroplating method. Preferably, the development process of the electrically conductive layer (113) is also known as the process of tracing conductive plating by using copper plating line, in which the conductive trace has a thickness in the range of 5~75 µm. Thereafter, the exposed third photo-resist materials (122) will be removed, leaving the second electrically conductive layer (113) disposed on the flat surface area of the surface of the stud conductive layer (105) and the encapsulation material being preferably epoxy molding compounds, epoxy laminates or polyimide laminates as illustrated in FIG. 13.

Figure 14:
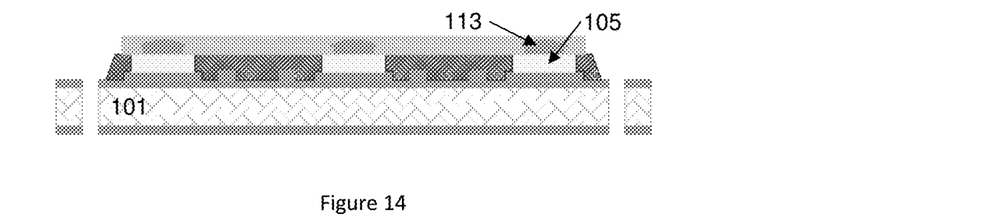
FIG. 14 illustrates a laminating layer developed or disposed on the base and exposed area of the stud conductive layer.

Then, a laminating layer is developed or disposed on the base (101) and the exposed area of the stud conductive layer (105) as illustrated in FIG. 14. This process is known as an isolation layer by using screen printing or coating, in which the isolation layer has a thickness in the control range of 5~50 µm. This isolation layer can also be alternatively executed by using an encap process by using an epoxy molding compound. Preferably, by molding or laminate and curing with b-stage adhesive laminate film or laminate and curing with prepreg resin or laminate and curing with resin.

Figure 15:
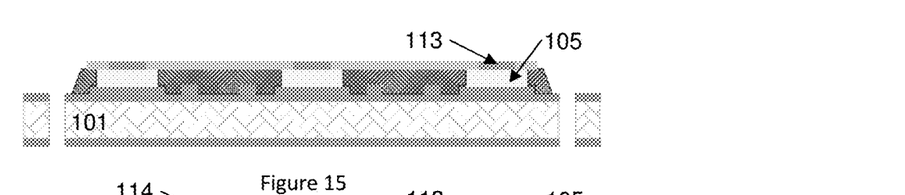
FIG. 15 illustrates the surface of the laminated area going through a grinding or polishing or trimming process known as surface grinding by either mechanical wheel grinding, chemical etching, laser trimming or plasma etching or any combination thereof.
Figure 16:
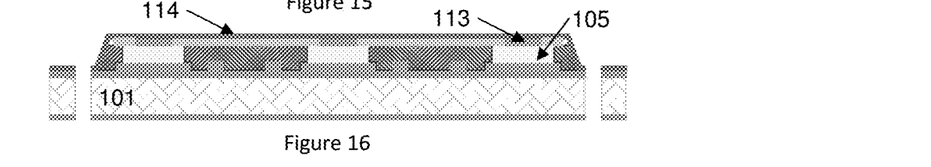
FIG. 16 illustrates a plating conductive seed layer disposed on the laminated area and the second electrically conductive layer.

Thereafter, the surface of the laminated area will go through a grinding or polishing or trimming process known as surface grinding by either mechanical wheel grinding, chemical etching, laser trimming or plasma etching or any combination thereof as illustrated in FIG. 15, preferably having thickness in the control range of 5~70 µm. The surface grinding will flatten the surface of the laminated area and the second electrically conductive layer (113) as illustrated in FIG. 16. Preferably, the etching process will have a thickness in the control range of 5~70 µm.

FIG. 16 illustrates a plating conductive seed layer (114) disposed on the laminated area and the second electrically conductive layer (113). Preferably, the conductive seed layer (114) is developed by using electroless plating line, in which the conductive seed layer (114) has a thickness in the range of 0.1~5 µm.

Figure 17:
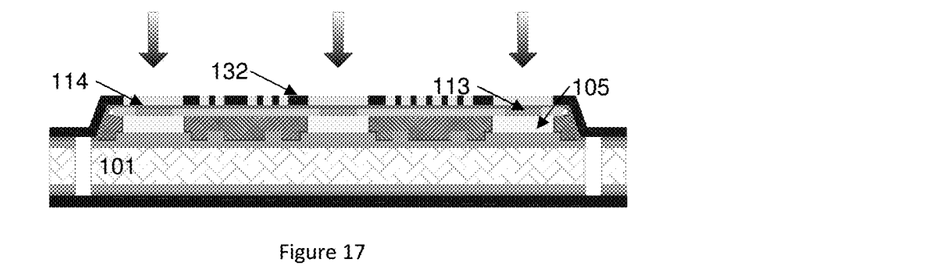
FIG. 17 illustrates layers of fourth photo-resist materials developed on the conductive seed layer.

Further, the process includes layers of fourth photo-resist materials (132) are developed on the conductive seed layer (114) as illustrated in FIG. 17. This process is also known as photo resist masking, in which the masking material can be dry film or liquid resist preferably having a thickness in the range of 5~100 µm.

Figure 18:
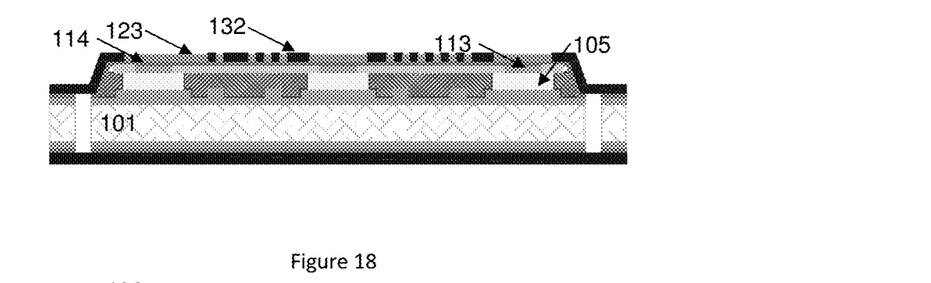
FIG. 18 illustrates development of a third electrically conductive layer within the removed or etched part of the layers of fourth photo-resist materials.
Figure 19:
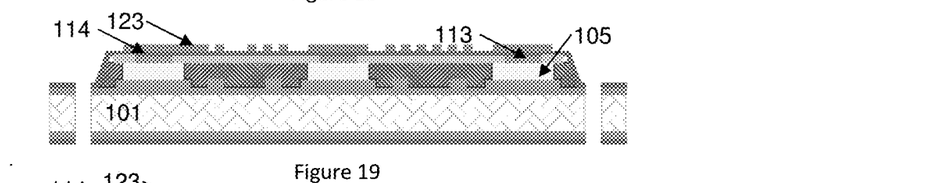
FIG. 19 illustrates the exposed fourth photo-resist materials will be removed, leaving the third electrically conductive layer disposed on the conductive seed layer.

FIG. 18 illustrates development of a third electrically conductive layer (123) within the removed or etched part of the layers of fourth photo-resist materials (132). Preferably, the fourth photo-resist materials are exposed by Ultra Violet (UV) exposure process, in which the unexposed zone will be removed by using a developer process. The third electrically conductive layer (123) developed by using an electroplating method. Preferably, the development process of the third electrically conductive layer (123) is also known as process of tracing conductive plating by using plating line, in which the conductive trace has a thickness in the range of 5~70 µm. Thereafter, the exposed fourth photo-resist materials (132) will be removed, leaving the third electrically conductive layer (123) disposed on the conductive seed layer (112) as illustrated in FIG. 19.

Figure 20:
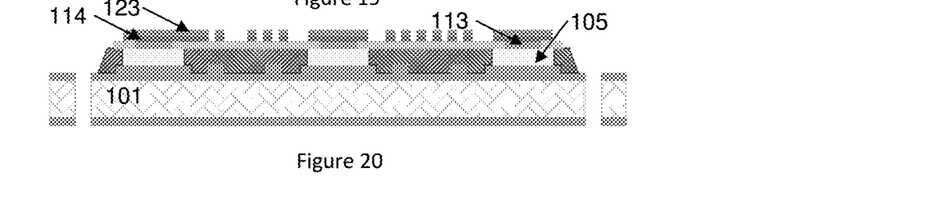
FIG. 20 illustrates selectively etching away a layer of the conductive seed layer by using semi-additive processing (SAP) or etching line.

Then, selectively etch away a layer of the conductive seed layer (112) by using semi-additive processing (SAP) or etching line as illustrated in FIG. 20. Thereafter, an isolation layer with a thickness in the range of 5~50 µm is printed, laminated or coated onto the surface by a screen printing machine or coater or a lamination process on the third electrically conductive layer (123) disposed on the conductive seed layer (112). Preferably, this process is referred to as a solder masking process. The process is further continued by exposing the solder masked surface with UV exposure machine or other similar process, in which this process will be able to remove the unexposed zone by developer processes as illustrated in FIG. 21.

Figures 21, 22:
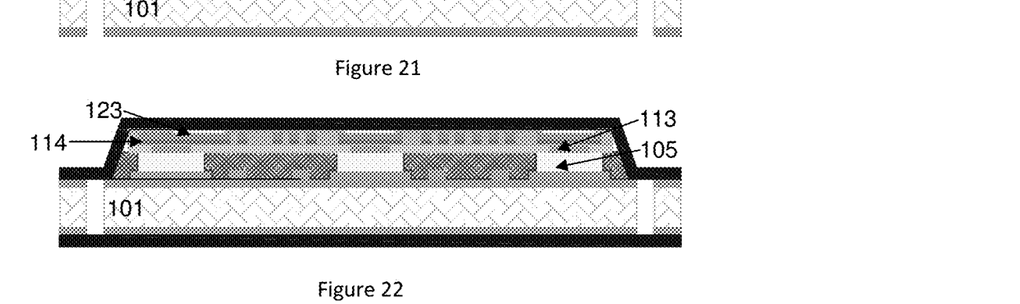
FIG. 21 illustrates exposing the solder masked surface with a UV exposure machine or other similar process, in which this process will be able to remove the unexposed zone by developer processes.
FIG. 22 illustrates a fifth layer photo-resist material disposed on the surface of the solder masked surface and bottom portion of the base.
Figure 23:
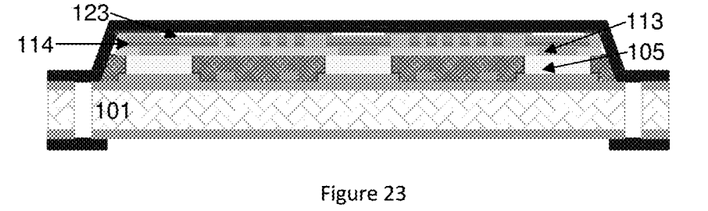
FIG. 23 illustrates an opening developed on the patterned fifth layer photo-resist material located at bottom portion of the base, wherein it is developed by using an Ultra Violet (UV) exposure process or similar developer processes, in which the unexposed zone will be removed by using developer processes.

FIG. 22 illustrates a fifth layer photo-resist material disposed on the surface of the solder masked surface and bottom portion of the base (101). Preferably, the process is known as a window etching dry film laminate process with dry film laminator, wherein the dry film having thickness in the range of 5~100 μm. Then, an opening is developed on the patterned fifth layer photo-resist material located at bottom portion of the base (101), wherein it is developed by using Ultra Violet (UV) exposure process or similar developer processes, in which the unexposed zone will be removed by using developer processes as shown in FIG. 23.

Figure 24:
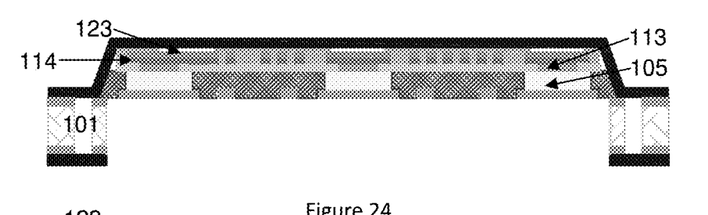
FIG. 24 illustrates a part of the base being removed, such that the area of the first patterned conductive layer is exposed to form at least an internal opening and at least a positioning opening.
Figure 25:
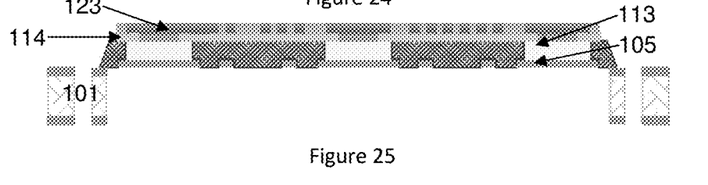
FIG. 25 illustrates a part of the first patterned conductive layer being removed, such that the area of the first patterned conductive layer is exposed to form at least an internal opening and at least a positioning opening.

Thereafter, the base (101) can be removed fully or selectively, to form at least an internal opening and at least a positioning opening, wherein the internal opening corresponds with an inside area of the first patterned conductive layer (103), and the positioning opening corresponds with an outside area of the first patterned conductive layer (103). The base (101) also can be removed, as well as at least one part of the first patterned conductive layer (103), such that the area of the first patterned conductive layer (103) is exposed to form at least an internal opening (107) and at least a positioning opening (107), as illustrated in FIGS. 24, 25, respectively.

The present invention may be embodied in other specific forms without departing from its essential characteristics. The described embodiments are to be considered in all respects only as illustrative and not restrictive. The scope of the invention is, therefore indicated by the appended claims rather than by the foregoing description. All changes, which come within the meaning and range of equivalency of the claims, are to be embraced within their scope.

What is claimed is:

1. A method of fabricating an integrated circuit packaging, comprising the steps of:
   establishing a base;
   developing a plurality of electrical circuits using a first patterned conductive layer on the base, wherein an electrical circuit are formed by using a masking material;
   developing a stud conductive layer, where the stud conductive layer is disposed on at least one side of the first patterned conductive layer by developing a second layer photo-resist material on the masking material;
   removing the masking material and second layer photo-resist material;
   developing an encapsulating material from epoxy or polyimide compound on the base and exposed area of the stud conductive layer;
   grinding the surface area of the encapsulating material to level the surface of the stud conductive layer and the encapsulating material to form a flattened surface area;
   developing third photo-resist materials on the flat surface area of the surface of the stud conductive layer and the encapsulating material;
   developing a second electrically conductive layer on the leveled stud conductive layer by removing at least one part of the layers of third photo-resist materials;
   developing an isolation layer on the flat surface area of the surface of the stud conductive layer and the encapsulating material;
   grinding the surface area of the isolation layer to level the surface primer ink layer and the second electrically conductive layer;
   developing an conductive seed layer on grinded surface of the isolation layer and the second electrically conductive layer;
   developing a fourth photo-resist materials on the conductive seed layer;
   developing a third electrically conductive layer by removing at least one part of the layers of fourth photo-resist materials;
   etching the conductive seed layer or third electrically conductive layer or any combination thereof by using etching process;
   developing a masking layer on the third electrically conductive layer disposed on the conductive seed layer.
   developing a solder mask or epoxy compound or polyimide compound layer by removing at least one part of the masking layer;
   developing a fifth layer photo-resist material disposed on the surface of the solder masked surface and bottom portion of the base; and
   developing an opening on the patterned fifth layer photo-resist material located at bottom portion of the base for etching selectively the base to form at least an internal opening and at least a positioning opening, wherein the internal opening corresponds with an inside area of the first patterned conductive layer, and the positioning opening corresponds with an outside area of the first patterned conductive layer.

2. The method of fabricating an integrated circuit packaging according to claim 1, further comprising the steps of: developing an interconnect on at least one side of the patterned conductive layer.

3. The method of fabricating an integrated circuit packaging according to claim 1, wherein the first patterned conductive layer and the second patterned conductive layer are disposed within the first patterned conductive layer, in which the other side of the first patterned conductive layer are located at the same plane with the second side of the second patterned conductive.

4. The method of fabricating an integrated circuit packaging according to claim 3, wherein the thickness of the first patterned conductive layer reduced by trimming at least one surface of the first patterned conductive layer.

5. The method of fabricating an integrated circuit packaging according to claim 1, wherein the surface of the first patterned conductive layer is trimmed by using chemical process or mechanical grinding process or laser trimming process or plasma treatment or any combination thereof.

6. The method of fabricating an integrated circuit packaging according to claim 1, wherein the masking material is a mask set or photolithography material or masked pattern or any combination thereof.

7. The method of fabricating an integrated circuit packaging according to claim 1, wherein the base is completely removed.

8. The method of fabricating an integrated circuit packaging according to claim 1, wherein the base is selectively removed to form at least an internal opening and at least a positioning opening of the first patterned conductive layer area, wherein the internal opening corresponds with an inside area of the first patterned conductive layer, and the positioning opening corresponds with an outside area of the first patterned conductive layer.

9. The method of fabricating an integrated circuit packaging according to claim 1, wherein positioning opening is formed using a positioning mark or half-etched indentation or patterns on the base.

10. The method of fabricating an integrated circuit packaging according to claim 1, wherein the base is a charge carrier.

11. The method of fabricating an integrated circuit packaging according to claim 1, wherein the step of removing the base, further comprising the steps of:
   etching the base by using the fifth layer photo-resist material; and
   removing the fifth layer photo-resist material.

12. The method of fabricating an integrated circuit packaging according to claim 1, wherein the step of etching the base further comprising the steps of:
   etching part of the first patterned conductive layer so that the surface of the etched first patterned conductive layer and the surface of the etched first patterned conductive layer are not located at the same plane.

13. The method of fabricating an integrated circuit packaging according to claim 1, wherein the masking material has at least a first opening and at least a second opening, the first opening is corresponding with the inside area of the first patterned conductive layer, and the second opening is corresponding with the outside area of the first patterned conductive layer.

\* \* \* \* \*